(12) United States Patent
Refai-Ahmed et al.

(10) Patent No.: US 8,796,842 B2
(45) Date of Patent: Aug. 5, 2014

(54) STACKED SEMICONDUCTOR CHIP DEVICE WITH THERMAL MANAGEMENT CIRCUIT BOARD

(75) Inventors: Gamal Refai-Ahmed, Markham (CA); Michael Z. Su, Round Rock, TX (US); Bryan Black, Spicewood, TX (US)

(73) Assignees: ATI Technologies ULC, Markham (CA); Advanced Micro Devices, Inc., Sunnyvale, CA (US)

(*) Notice: Subject to any disclaimer, the term of this patent is extended or adjusted under 35 U.S.C. 154(b) by 298 days.

(21) Appl. No.: 12/860,244

(22) Filed: Aug. 20, 2010

(65) Prior Publication Data

US 2012/0043669 A1    Feb. 23, 2012

(51) Int. Cl.
    *H01L 23/34*      (2006.01)

(52) U.S. Cl.
    USPC .............. 257/713; 257/719; 257/E23.169

(58) Field of Classification Search
    USPC ......... 257/777, E21.499, E23.169, 713, 719, 257/722; 438/109, 122
    See application file for complete search history.

(56) References Cited

U.S. PATENT DOCUMENTS

| | | | | |
|---|---|---|---|---|
| 4,742,385 A * | 5/1988 | Kohmoto | ............ | 257/697 |
| 5,365,402 A * | 11/1994 | Hatada et al. | ............ | 361/699 |
| 6,239,487 B1 * | 5/2001 | Park et al. | ............ | 257/712 |
| 6,580,611 B1 * | 6/2003 | Vandentop et al. | ............ | 361/704 |
| 7,198,980 B2 | 4/2007 | Jiang et al. | | |
| 7,208,828 B2 * | 4/2007 | Cher 'Khng et al. | ............ | 257/687 |
| 2002/0149095 A1 * | 10/2002 | Eldridge | ............ | 257/678 |
| 2005/0167798 A1 | 8/2005 | Doan | | |
| 2006/0043581 A1 * | 3/2006 | Prokofiev | ............ | 257/713 |
| 2006/0065972 A1 * | 3/2006 | Khan et al. | ............ | 257/712 |
| 2009/0116194 A1 * | 5/2009 | Matsushiba et al. | ............ | 361/709 |
| 2011/0156244 A1 * | 6/2011 | Lou | ............ | 257/713 |

\* cited by examiner

*Primary Examiner* — Wael Fahmy
*Assistant Examiner* — Sarah Salerno
(74) *Attorney, Agent, or Firm* — Timothy M. Honeycutt

(57) ABSTRACT

A method of assembling a semiconductor chip device is provided that includes providing a circuit board including a surface with an aperture. A portion of a first heat spreader is positioned in the aperture. A stack is positioned on the first heat spreader. The stack includes a first semiconductor chip positioned on the first heat spreader and a substrate that has a first side coupled to the first semiconductor chip.

25 Claims, 5 Drawing Sheets

STACKED SEMICONDUCTOR CHIP DEVICE WITH THERMAL MANAGEMENT CIRCUIT BOARD

BACKGROUND OF THE INVENTION

1. Field of the Invention

This invention relates generally to semiconductor processing, and more particularly to thermal management structures for stacked semiconductor chips and to methods of assembling the same.

2. Description of the Related Art

Many current integrated circuits are formed as multiple dice on a common wafer. After the basic process steps to form the circuits on the dice are complete, the individual die are singulated from the wafer. The singulated die are then usually mounted to structures, such as circuit boards, or packaged in some form of enclosure.

One frequently-used package consists of a substrate upon which a die is mounted. The upper surface of the substrate includes electrical interconnects. The die is manufactured with a plurality of bond pads. A collection of solder joints are provided between the bond pads of the die and the substrate interconnects to establish ohmic contact. After the die is mounted to the substrate, a lid is attached to the substrate to cover the die. Some conventional integrated circuits, such as microprocessors, generate sizeable quantities of heat that must be transferred away to avoid device shutdown or damage. The lid serves as both a protective cover and a heat transfer pathway.

To provide a heat transfer pathway from the integrated circuit to the lid, a thermal interface material is placed on the upper surface of the integrated circuit. In an ideal situation, the thermal interface material fully contacts both the upper surface of the integrated circuit and the portion of the lower surface of the lid that overlies the integrated circuit. Conventional thermal interface materials include various types of pastes, and in some cases, a metal. Gel-type thermal interface materials consist of a polymeric matrix interspersed with thermally conductive particles, such as aluminum. More recently, designers have begun to turn to solder materials as a thermal interface material, particularly for high power-high temperature chips.

A solder thermal interface material like indium has favorable thermal properties that work well for high power-high temperature die. However, indium exhibits relatively poor adhesion to silicon. To facilitate bonding with indium, the backside of a silicon die may be provided with a metallization stack that includes a layer that readily adheres to silicon, a layer that readily wets indium and perhaps one or more intermediary barrier or other layers. An entire wafer of dice may be provided with respective metallization stacks en masse prior to dicing. To establish favorable thermal contact between a conventional solder thermal interface material and the semiconductor chip and lid that bracket it, a reflow process is performed to wet the applicable surfaces.

Stacked dice present an additional technical challenge for integration of both solder and organic thermal interface materials. A stacked dice arrangement is non-planar relative to the underlying package substrate, yet thermal contact between the solder thermal interface material, each chip and the lid is often desired. The non-planarity can lead to inadequate thermal pathways to dissipate heat from the lowermost chip in the stack. This can limit the power and size for the lowermost die.

Aside from the thermal management difficulties, stacked dice present form factor challenges. The very nature of stacking multiple dice tends to increase the heights of such arrangements. Burgeoning package height may not cause design issues for certain types of systems, such as desktop machines. Yet space to accommodate integrated circuit packages may be at a premium for compact electronic components, such as portable communications devices.

The present invention is directed to overcoming or reducing the effects of one or more of the foregoing disadvantages.

SUMMARY OF EMBODIMENTS OF THE INVENTION

In accordance with one aspect of an embodiment of the present invention, a method of assembling a semiconductor chip device is provided that includes providing a circuit board including a surface with an aperture. A portion of a first heat spreader is positioned in the aperture. A stack is positioned on the first heat spreader. The stack includes a first semiconductor chip positioned on the first heat spreader and a substrate that has a first side coupled to the first semiconductor chip.

In accordance with another aspect of an embodiment of the present invention, a method of manufacturing is provided that includes fabricating a circuit board including a surface with an aperture and positioning a portion of a first heat spreader in the aperture. A stack is positioned on the first heat spreader. The stack includes a first semiconductor chip positioned on the first heat spreader and a substrate that has a first side coupled to the first semiconductor chip.

In accordance with another aspect of an embodiment of the present invention, an apparatus is provided that includes a circuit board that has a surface with an aperture. A first heat spreader includes a portion positioned in the aperture. A stack is positioned on the first heat spreader. The stack includes a first semiconductor chip positioned on the first heat spreader and a substrate that has a first side coupled to the first semiconductor chip.

In accordance with another aspect of an embodiment of the present invention, an apparatus is provided that includes a semiconductor chip package substrate that has a surface with an aperture. A first heat spreader includes a portion positioned in the aperture. A stack is positioned on the first heat spreader. The stack includes a first semiconductor chip positioned on the first heat spreader, an interposer that has a first side coupled to the first semiconductor chip and a second side, and a second semiconductor chip coupled to the second side.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various stacked semiconductor chip arrangements are disclosed. The disclosed embodiments incorporate a circuit board with an aperture to accommodate at least a portion of a heat spreader. The heat spreader is operable to dissipate heat from a lowermost semiconductor chip in the chip stack. The aperture reduces the form factor of the stack while still providing thermal management. Additional details will now be described.

Figure 1:
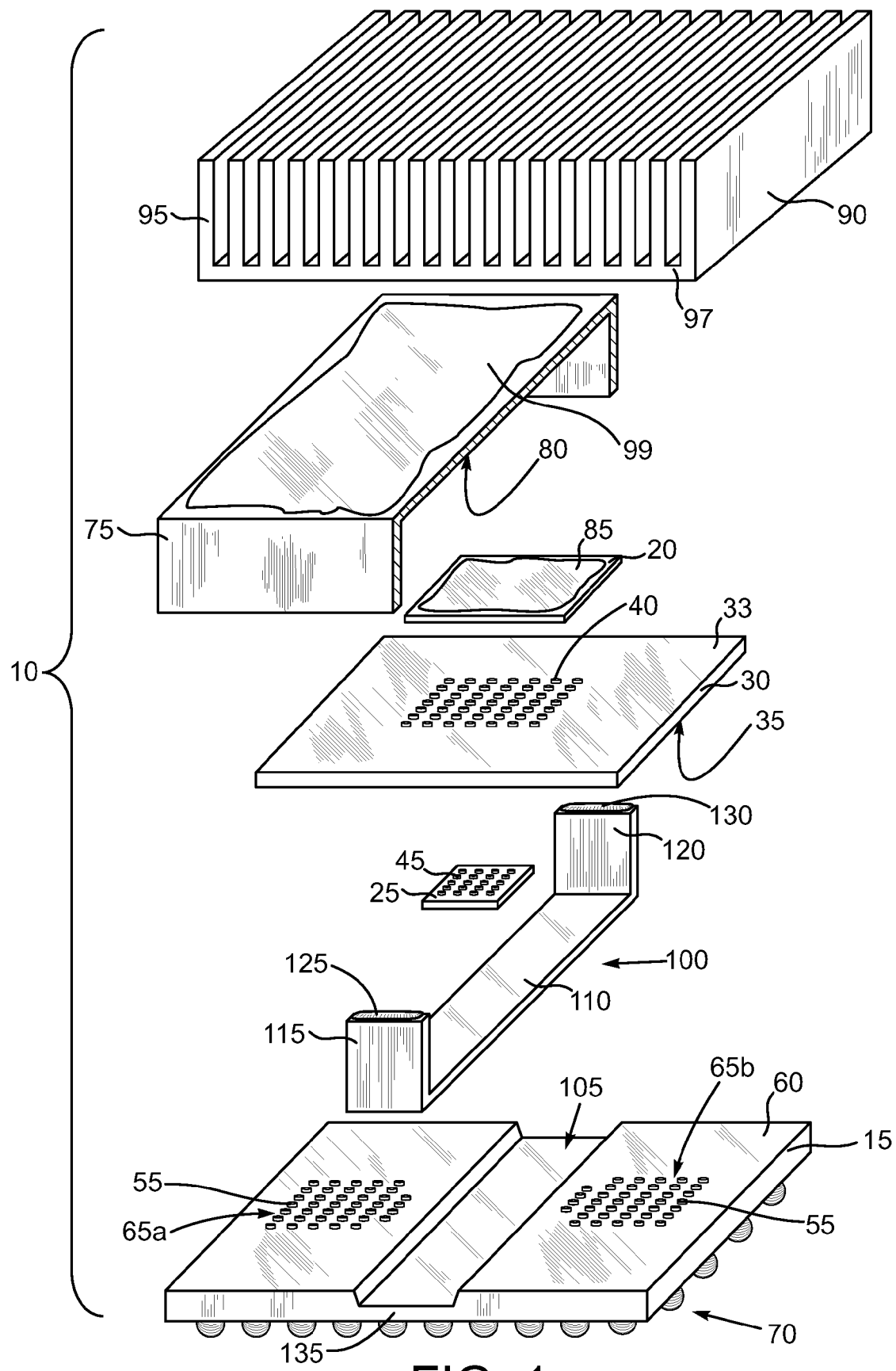
FIG. 1 is an exploded pictorial view of an exemplary embodiment of a semiconductor chip device that includes a circuit board that is suitable to receive and electrically interface with a stack of semiconductor chips consisting of semiconductor chips mounted to an interposer.

In the drawings described below, reference numerals are generally repeated where identical elements appear in more than one figure. Turning now to the drawings, and in particular to FIG. 1 is an exploded pictorial view of an exemplary embodiment of a semiconductor chip device 10 that includes a circuit board 15 that is suitable to receive and electrically interface with a stack of semiconductor chips consisting of semiconductor chips 20 and 25 mounted to an interposer 30. The semiconductor chip 20 is mounted to a principal side 33 and the semiconductor chip 25 is mounted to the opposite principal side 35 of the interposer 30. In this illustrative embodiment, the semiconductor chips 20 and 25 are mounted to the interposer 30. However, as described in more detail herein, the number of semiconductor chips implemented in a given stack as well as the configuration of the interposer 30 is subject to great variety. For example, the interposer 30 may be simply another semiconductor chip as opposed to purely an interposer. The semiconductor chip device 10 may be used to implement a large number of different functions. Thus, the semiconductor chips 20 and 25 may be selected from numerous types of integrated circuits. Examples include microprocessors, graphics processors, combined microprocessor/graphics processors, application specific integrated circuits, memory devices, active optical devices, such as lasers, or the like, and may be single or multi-core. The semiconductor chips 20 and 25 may be constructed of bulk semiconductor, such as silicon or germanium, or semiconductor on insulator materials, such as silicon-on-insulator materials.

The interposer 30 may take on a variety of configurations. If typically configured, the interposer 30 may consist of a substrate of a material(s) with a coefficient of thermal expansion (CTE) that is near the CTE of the semiconductor chips 20 and 25 and that includes plural internal conductor traces and vias for electrical routing. Various semiconductor materials may be used, such as silicon, germanium or the like. Silicon has the advantage of a favorable CTE and the widespread availability of mature fabrication processes. Of course, the interposer could also be fabricated as an integrated circuit like the other semiconductor chips 20 and 25. In either case, the interposer 30 could be fabricated on a wafer level or chip level process. Indeed, the semiconductor chips 20 and 25 could be fabricated on either a wafer or chip level basis, and then singulated and mounted to an interposer 30 that has not been singulated from a wafer. Singulation of the interposer 30 would follow mounting of the semiconductor chips 20 and 25.

Similarly, the circuit board 15 may take on a variety of configurations. Examples include a semiconductor chip package substrate, a circuit card, or virtually any other type of printed circuit board. Although a monolithic structure could be used for the circuit board 15, a more typical configuration will utilize a buildup design. In this regard, the circuit board 15 may consist of a central core upon which one or more buildup layers are formed and below which an additional one or more buildup layers are formed. The core itself may consist of a stack of one or more layers. If implemented as a semiconductor chip package substrate, the number of layers in the circuit board 15 can vary from four to sixteen or more, although less than four may be used. So-called "coreless" designs may be used as well. The layers of the circuit board 15 may consist of an insulating material, such as various well-known epoxies, interspersed with metal interconnects. A multi-layer configuration other than buildup could be used. Optionally, the circuit board 25 may be composed of well-known ceramics or other materials suitable for package substrates or other printed circuit boards. The circuit board 15 is provided with a number of conductor traces and vias and other structures (not visible) in order to provide power, ground and signals transfers between the semiconductor chips 20 and 25 and another device, such as another circuit board for example.

The semiconductor chip 20 may interface electrically with the interposer 30 by way of plural interconnect structures 40 which are positioned on the upper surface 27 of the interposer 30. The interconnect structures 40 may be conductive bumps, conductive pillars, spring interconnects or the like. Indeed, if desired the semiconductor chip 20 may be provided with a corresponding plurality of interconnect structures that may join electrically with the interconnect structures 40 if desired. For example, the semiconductor chip 20 might be provided with plural solder bumps which will join metallurgically with the interconnect structures 40 during a reflow process. The same is true with regard to the electrical interface between the semiconductor chip 25 and the interposer 30. In this regard, the semiconductor chip 25 may be provided with plural interconnect structures 45 which like the interconnect structures 40, may be conductive bumps composed of solder or other materials, conductive pillars composed of copper or other materials or the like. To interface the interposer 30 electrically with a circuit board 15, a plurality of interconnect structures 55 may be disposed on a principal surface 60 of the circuit board 15. The interconnect structures 55 are segregated into two groups 65a and 65b. The purpose of this segregation in this illustrative embodiment will be described in more detail below. The interconnect structures 55 may, like the interconnect structures 40 and 45, be composed of conductive bumps, conductive pillars, etc. The circuit board 15 may be mounted on another circuit board (not shown) and electrically interconnected thereto by plural interconnect structures 70, which in this illustrative embodiment consist of solder balls. However, other types of interconnect structures such as pin grid arrays, land grid arrays or other types of interconnect structures may be used as well.

An exemplary thermal management system for the semiconductor chip device 10 will be described now in conjunction with FIG. 1. To provide a thermal pathway to dissipate heat from the semiconductor chip 20 and the interposer 30, a heat spreader or lid 75 (shown in half-section) may be provided that is designed to seat on the circuit board 15 and includes an underside 80 that is intended to establish thermal contact with the semiconductor chip 20. The lid 75 may be a bath tub design as depicted, a top hat design or some other configuration as desired. The lid 30 may be composed of well-known ceramics or metallic materials as desired. Some exemplary materials include nickel plated copper, anodized aluminum, aluminum-silicon-carbon, aluminum nitride, boron nitride or the like. To facilitate the thermal contact between the semiconductor chip 20 and the underside 80, a thermal interface material 85 may be applied to the semiconductor chip 20. The thermal interface material 85 may be composed of a variety of different types of thermal interface materials, such as, various solders or organic thermal interface materials. Exemplary metallic materials include, for example, indium, indium solder, tin-silver, bismuth-tin, other tin solders, gallium plus a polymer or the like. Various non-metallic materials include a variety of polymeric materials suitable for thermal interface materials such as, for example, silicone rubber mixed with zinc oxide. Optionally, compliant base materials other than silicone rubber and thermally but not electrically conductive particles may be used. Another heat spreader 90 may be seated on the lid or heat spreader 75 and used to dissipate heat by way of either passive or active fluid flow. Here, the heat spreader 90 is provided with a plurality of parallel spaced fins 95 joined integrally with and projecting away from a base 97. However, the skilled artisan will appreciate that the configuration of the heat spreader 90 may take on a very large variety of different configurations. Exemplary materials include copper, nickel, aluminum, steel, combinations of these or the like. Somewhat more exotic materials, such as diamond or sapphire, could also be used for extreme thermal environments. A thermal interface material 99 may be applied to the lid 75 or the heat spreader 90 or both to facilitate thermal contact.

To facilitate the dissipation of heat from the semiconductor chip 25, a heat spreader 100 is positioned between the semiconductor chip 25 and the circuit board 15. To accommodate the heat spreader 100 and the semiconductor chip 25, the circuit board 15 may be provided with a channel 105. Here, the exemplary heat spreader 100 includes a base portion 110 and two oppositely positioned projections 115 and 120. The base 110 is designed to be seated in the channel 105 of the circuit board 15. The projections 115 and 120 are designed to establish thermal contact with the underside 80 of the lid 75. This embodiment incorporates two projections 115 and 120, but since their function is to establish thermal contact with the lid 75, one or more could be used. The heat spreader 100 may be composed of a variety of materials suitable for heat transfer devices, such as, copper, nickel, aluminum, steel, combinations of these or the like. If fashioned form such materials, various fabrication techniques may be used, such as stamping, forging, machining, casting, soldering, brazing, combinations of these or the like. Somewhat more exotic materials, such as diamond or sapphire, could also be used for extreme thermal environments. To facilitate thermal contact with the lid 75, the projection 115 may be provided with a thermal interface material 125 and the projection 120 may be provided with a corresponding thermal interface material 130. The thermal interface materials 125 and 130 may be composed of the same types of materials as the thermal interface material 85 described above.

In this illustrative embodiment, the channel 105 may extend across the entire expanse of the circuit board 15. In other embodiments to be described below, the channel 105 need not extend entirely across the surface of a circuit board. Note that the heat spreader 100 not only facilitates the transfer of heat from the semiconductor chip 25 but also from the circuit board 15 and to a degree the interposer 30 as well. The channel 105 does not extend entirely through the thickness of the circuit board 15. This leaves the portion 135 of the circuit board available for the placement of metallization lines and traces that are interspersed within layers of non-conducting material within the circuit board 15. Since the channel 105 does eliminate some portions of the circuit board 15 that would otherwise be available for the routing and traces, the loss of available circuit board volume will have to be compensated during layout of the conductor traces for the circuit board 15.

Figure 2:
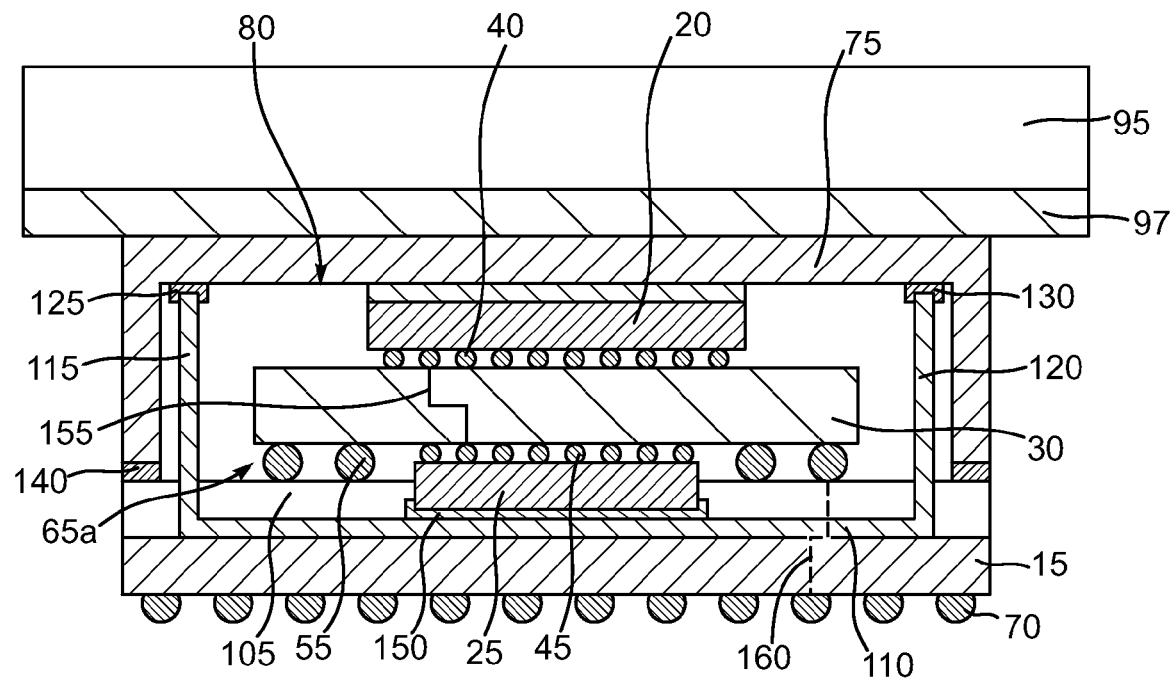
FIG. 2 is a sectional of the exemplary semiconductor chip device.

Additional details of the semiconductor chip device 10 may be understood by referring now also to FIG. 2, which is a sectional view of the semiconductor chip device 10 taken long wise through the channel 105 of the circuit board 15. Here, the semiconductor chip device 10 is shown fully assembled such that the lid 75 is seated on the circuit board 15 and secured thereto by a suitable adhesive 140 and the heat spreader 90 is positioned on the lid 75. The location of the section for FIG. 2 is such that the base 97 of the heat spreader 90 is shown in section but one of the fins 95 is not. The adhesive 140 used to secure the lid 75 may be composed of a well-known thixotropic adhesive, an epoxy, another type of polymer or even a solder. The heat spreader 100 is seated in the channel 105 and the projections 115 and 120 thereof are in thermal contact with the underside 80 of the lid 75 by way of the thermal interface materials 125 and 130. A few of the interconnect structures 55 of the group 65a that link the interposer 30 to the circuit board 15 are visible. In addition, the interconnect structures 40 that link the semiconductor chip 20 to the interposer 30 are visible as well as the interconnect structures 45 that link the undermount semiconductor chip 25 to the interposer 30. To facilitate heat transfer from the semiconductor chip 25 to the base 110 of the heat spreader 100, a thermal interface material 150 may be positioned between the base 110 and the semiconductor chip 25. This thermal interface material 150 could be any of the non-metallic or metallic thermal interface materials described elsewhere herein. If a solder-type thermal interface material is selected for the thermal interface material 150, then the side of the semiconductor chip 25 facing the thermal interface material 150 may be provided with an appropriate back side metallization (not shown) that facilitates metallurgical wetting to a solder material.

Still referring to FIG. 2, the interposer 30 may be provided with plural routing structures that enable electrical interfacing between the interconnect structures 40 of the semiconductor chip 20 and the interconnect structures 45 of the semiconductor chip 25. One of these interface structures is represented schematically by the line 155. It should be understood that the interconnect structure 155 may be a thru-silicon via, a collection of routing traces or virtually any other type of interconnect structure. The same is true with regard to conductor structures within the circuit board 15 that enable electrical interfaces between the interface structures 55 and the solder balls 70. In this regard one of those exemplary interconnect structures is depicted schematically by the dashed line 160. The line 160 is shown in dashed since it does not appear in section.

It is anticipated that the circuit board 15 may be fabricated along with the channel 105 in a variety of ways. For example, either material removal or deliberate patterning techniques may be used to establish the channel 105. In this regard, the circuit board 15 could be fabricated as a relatively planar structure and thereafter a suitable material removal process may be used in order to form the channel 105. Again, electrical routing structures, such as the routing structure 160, would have to be placed outside the location of where the channel 105 is intended to be made. The material removal could be by chemical etch, laser oblation or other material removal techniques. On the other hand, if a patterning technique is used to establish a channel 105, then the channel 105 may be formed as the circuit board 15 is formed. This may be accomplished for example where the circuit board 15 is of a buildup design by some sort of hard masking in the location where the channel is to be formed during each subsequent insulating material deposition step so that material is not positioned where the channel 105 is intended to be. Obviously such hard masking would have to be by way of a material that does not readily wet to whatever epoxies or other types of organic compounds that are used to form the various buildup layers that make up the circuit board 15 in that context.

An exemplary method of assembling the semiconductor chip device 10 may be understood by referring again to FIGS. 1 and 2. Prior to attachment of the lid 75 to the circuit board 15, the stack consisting of the semiconductor chips 20 and 25 and the interposer 30 may be assembled using, for example, flip-chip mounting and reflow processes as necessary. The heat spreader 100 may be seated on the circuit board 15 with a portion, say the base 110 thereof, positioned in the aperture or channel 105. The stack may be positioned so that the semiconductor chip 25 is in thermal contact with the heat spreader 100 and at least partially in the aperture 105. Appropriate thermal materials may be applied where appropriate and the lid 75 may be mounted to the circuit board 15. Any requisite curing steps, for solder or adhesives, may be performed.

Figure 3:
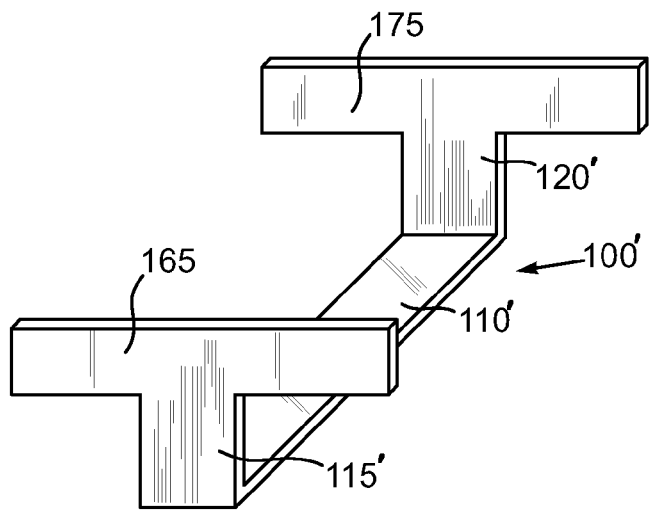
FIG. 3 is a pictorial view of an alternate exemplary heat spreader for use with an embodiment of a stacked semiconductor chip device.

In the illustrative embodiment depicted in FIGS. 1 and 2, the base 110 and projections 115 and 120 of the heat spreader 100 have approximately the same width. However, it may be possible to configure a similar heat spreader with additional contact area to lower the heat flux and thus raise the ability of the heat spreader to dissipate heat. In this regard, attention is now turned to FIG. 3, which is a pictorial view of an alternate exemplary embodiment of a heat spreader 100' that includes a base 110' that may be configured substantially like the base 110 depicted in FIGS. 1 and 2. In this illustrative embodiment, however, projections 115' and 120' coupled to the base 110' may have wings 165 and 170 which are much wider than both the base 110' and the projections 115' and 120'. The wings 165 and 175 are intended to make thermal contact with the underside 80 of the lid depicted in FIGS. 1 and 2, but with much greater contact area and thus greater capability of transferring heat. The heat spreader 100' may be composed of the same materials as the heat spreader 100 described elsewhere herein.

Figure 4:
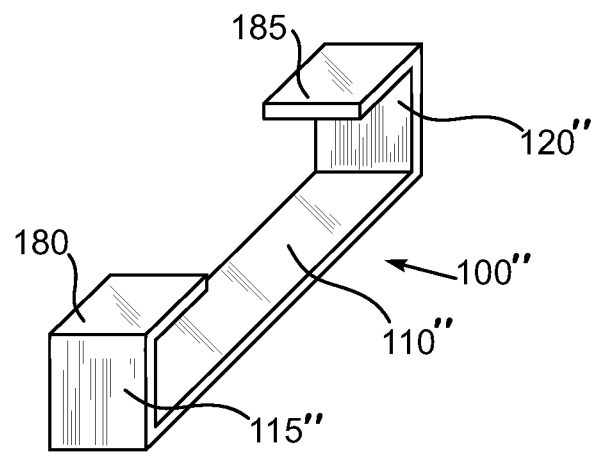
FIG. 4 is a pictorial view of another alternate exemplary heat spreader for use with an embodiment of a stacked semiconductor chip device.

In another alternate exemplary embodiment depicted pictorially in FIG. 4, a heat spreader 100" may include a base 110" that may be configured substantially like the base 110 depicted in FIGS. 1 and 2. Here however, projections 115" and 120" connected to the base 110" may include overhead flats 180 and 185 that are intended to establish thermal contact with the underside 80 of the lid 75 depicted in FIGS. 1 and 2. Here, the flats 180 and 185 provide enlarged surface areas to again provide greater contact area for lower thermal resistance for heat transfer. The heat spreader 100" may be composed of the same materials as the heat spreader 100 described elsewhere herein.

Figure 5:
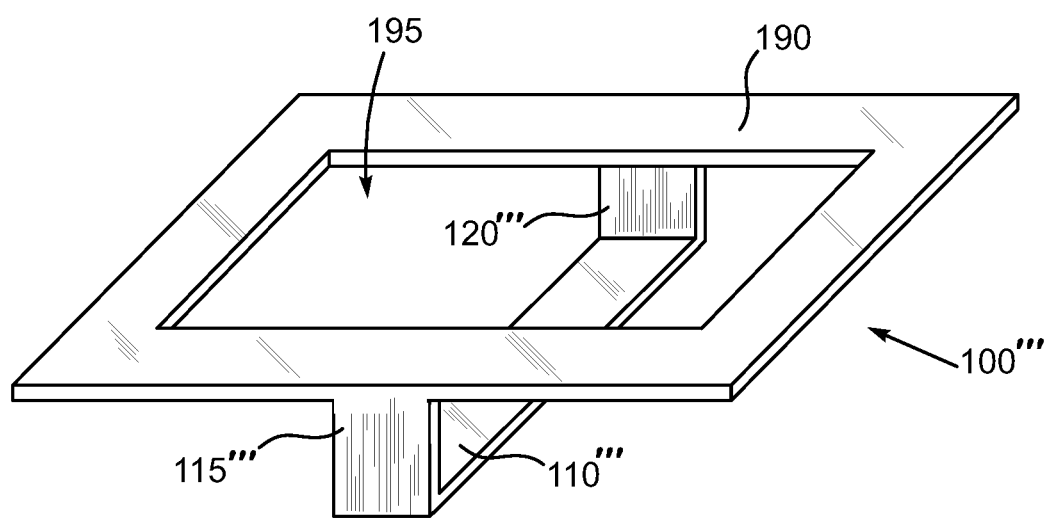
FIG. 5 is a pictorial view of another alternate exemplary heat spreader for use with an embodiment of a stacked semiconductor chip device.

Another alternate exemplary embodiment of a heat spreader 100''' may be understood by referring now to FIG. 5, which is a pictorial view. In this illustrative embodiment, the heat spreader 100''' may include a base member 110' which may be configured substantially like the base member 110 depicted in FIGS. 1 and 2. Here, the projections 115''' and 120''' may be connected to the base member 110'. In this illustrative embodiment, a frame 190 may be connected to the projections 115' and 120'''. The frame 190 is designed to establish a large thermal contact area with the underside 80 of the lid 75 depicted in FIGS. 1 and 2. The frame 190 has, by definition, an opening 195 that is designed to accommodate both the position and placement of the stack consisting of the semiconductor chips 20 and 25 and the interposer 30 when fully assembled. In this illustrative embodiment, the frame 190 is roughly square. However, other footprints could be used as desired. The heat spreader 100''' may be composed of the same materials as the heat spreader 100 described elsewhere herein.

Figure 6:
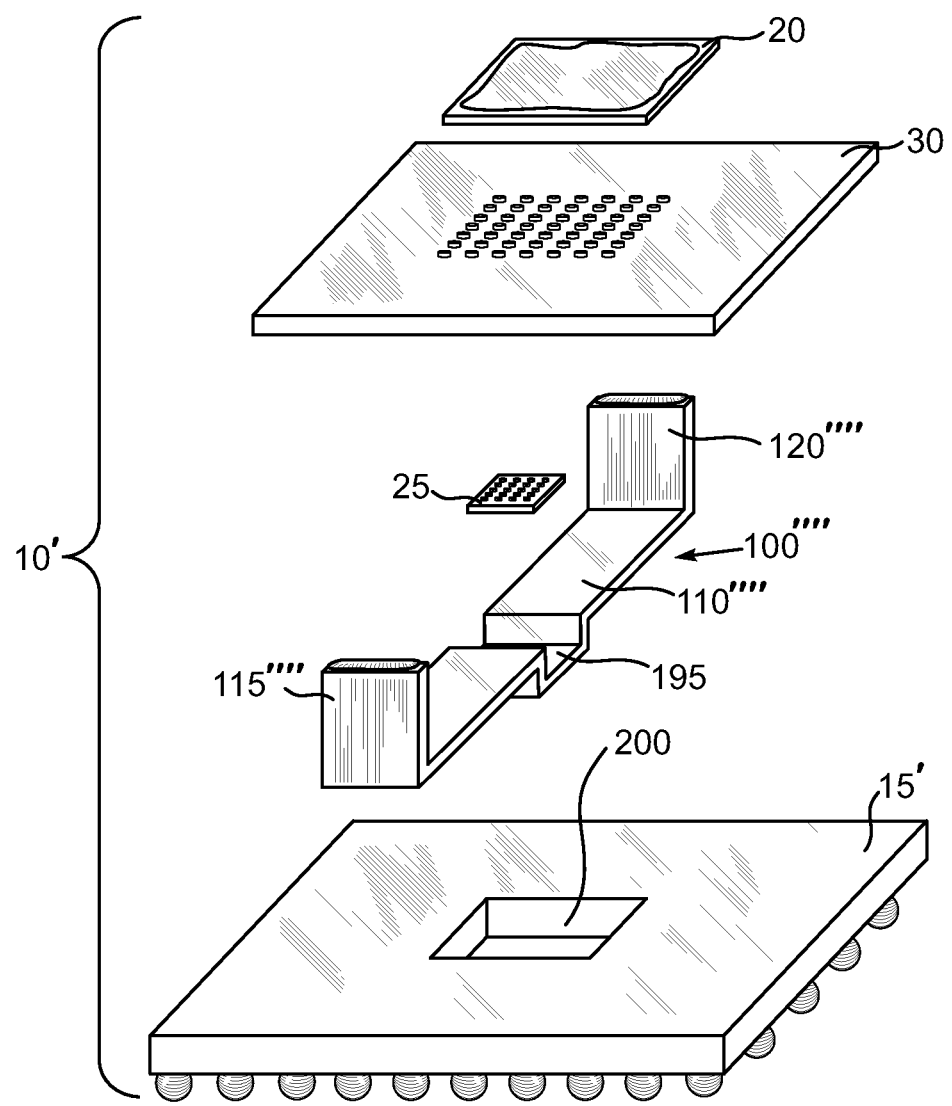
FIG. 6 is an exploded pictorial view of an alternate exemplary embodiment of a semiconductor chip device that includes a circuit board that is suitable to receive and electrically interface with a stack of semiconductor chips consisting of semiconductor chips mounted to an interposer.

As noted above, a circuit board incorporating a heat spreader for transferring heat from a stack may be provided with a channel that does not extend across the entire expanse of the circuit board. In this regard, attention is now turned to FIG. 6, which is an exploded pictorial view of an alternate exemplary semiconductor chip device 10'. The semiconductor chip device 10' may include a stack consisting of the semiconductor chip 20, the interposer 30 and the semiconductor chip 25 that are all configured as substantially described elsewhere herein. The circuit board 15' is designed to receive a heat spreader 100'''' that consists of a base 110'''' and projections 115'''' and 120''''. The projections are, like the other embodiments described herein, designed to establish thermal contact with, for example, the underside 80 of the lid 75 depicted in FIGS. 1 and 2. The base 110'''' of the heat spreader 100'''' is not planar. Rather, the base 110'''' includes a portion or sub-base 195 that projects from the base 110' in direction opposite from the projections 115'''' and 120''''. The sub-base 195 is designed to seat in an aperture 200 in the circuit board 15'. In this illustrative embodiment, the aperture 200 does not extend across the entire expanse of the circuit board 15'. The aperture 200 may have the same general (albeit slightly larger) footprint as the sub-base 195, although any shape will suffice so long as there is adequate clearance. If desired, the aperture 200 may be substantially centered on the circuit board 15' or located at virtually any other location that is technically feasible. When assembled, the semiconductor chip 25 will be seated on and in thermal contact with the sub-base 195 by way of an optional thermal interface material like the thermal interface material 150 depicted in FIG. 2.

Figure 7:
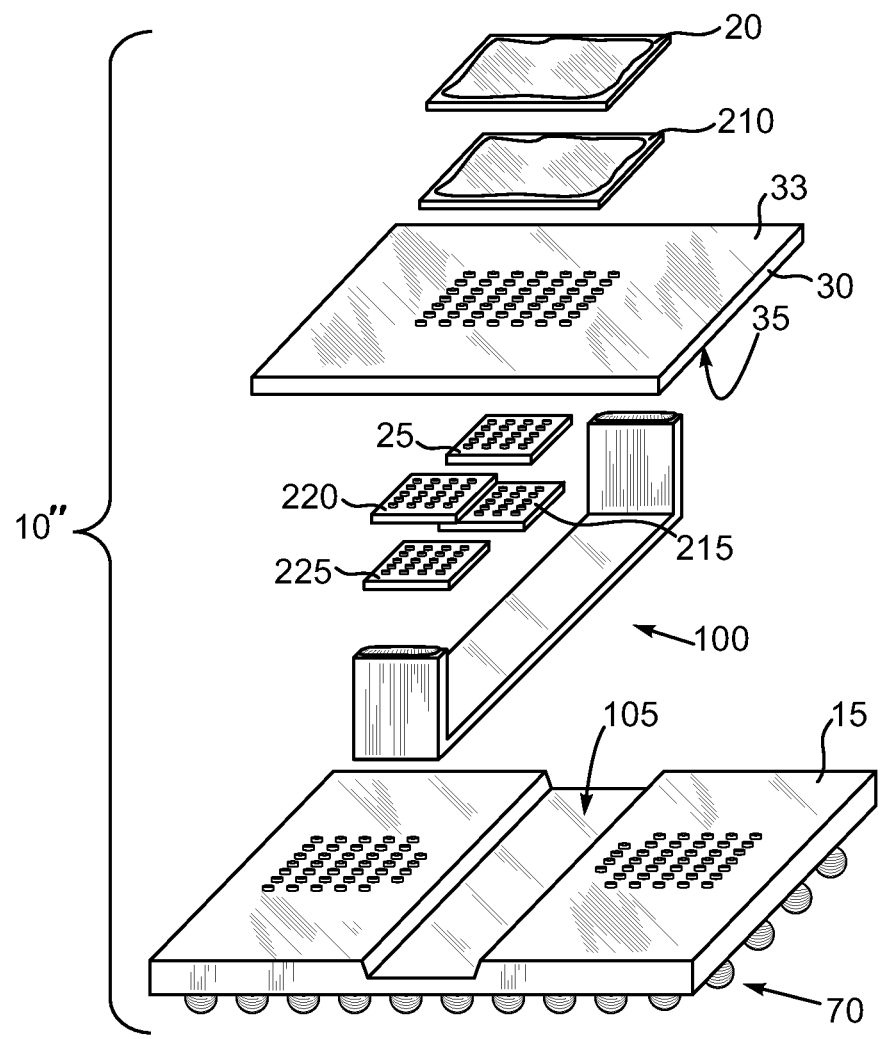
FIG. 7 is an exploded pictorial view of another alternate exemplary embodiment of a semiconductor chip device that includes a circuit board that is suitable to receive and electrically interface with a stack of semiconductor chips consisting of semiconductor chips mounted to an interposer.

Any of the disclosed embodiments of the semiconductor chip device may include more than two chips mounted to an interposer. This variability is depicted in FIG. 7, which is an exploded pictorial view of an alternate exemplary embodiment of a semiconductor chip device 10". The semiconductor chip device 10" includes a circuit board 15 that is designed to receive a stack consisting of two semiconductor chips 20 and 210 mounted on the interposer 30 and two semiconductor chips 30 and 215 stacked and mounted on the opposite side 35 of the interposer 30 as generally described elsewhere herein. In addition, semiconductor chips 220 and 225 may be mounted on the side 35 of the interposer 30 in a stacked arrangement or simply in lateral relation to the semiconductor chips 30 and 215. Indeed, a great variety of different types of configurations and combinations of semiconductor chips mounted on the surfaces 27 and 35 of the interposer 30 may be accommodated. Regardless of the particular configuration of the various semiconductor chips 20, 210, 30, 215, 220 and 225, a heat spreader, such as the heat spreader 100, may be positioned in the channel 105 of the circuit board 15 and used to facilitate heat transfer from the semiconductor chips 30, 215, 220 and 225 to a heat spreader arrangement such as the lid 75 and the heat spreader 90 depicted in FIGS. 1 and 2.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of assembling a semiconductor chip device, comprising:
    providing a circuit board including a first side and a second side opposite to the first side, the second side having an aperture that does not extend to the first side;
    positioning a first heat spreader on the second side, the first heat spreader including a first portion in the aperture and with a surface facing away from the aperture, and a second portion including at least one projection extending beyond the aperture and adapted to thermally contact a second heat spreader; and
    positioning a stack on the second side, the stack including a first semiconductor chip positioned on the surface of the first heat spreader and a substrate having a first side coupled to the first semiconductor chip.

2. The method of claim 1, wherein the circuit board comprises a chip package substrate.

3. The method of claim 1, comprising placing a second heat spreader in thermal contact with the at least one projection.

4. The method of claim 3, wherein the second heat spreader comprises a lid coupled to the circuit board.

5. The method of claim 1, wherein the substrate comprises a second semiconductor chip.

6. The method of claim 1, comprising coupling a third semiconductor chip to a second side of the substrate.

7. A method of manufacturing, comprising:
    fabricating a circuit board including a first side and a second side opposite to the first side, the second side having an aperture that does not extend to the first side;
    positioning a first heat spreader on the second side so that a first portion of a first heat spreader is in the aperture and with a surface facing away from the aperture, and a second portion including at least one projection extending beyond the aperture and adapted to thermally contact a second heat spreader; and
    positioning a stack on the second side, the stack including a first semiconductor chip positioned on the surface of the first heat spreader and a substrate having a first side coupled to the first semiconductor chip.

8. The method of claim 7, comprising forming the aperture by material removal.

9. The method of claim 7, wherein the aperture comprises a channel.

10. The method of claim 7, comprising placing a second heat spreader in thermal contact with the at least one projection.

11. The method of claim 10, wherein the second heat spreader comprises a lid coupled to the circuit board.

12. The method of claim 10, wherein the substrate comprises a second semiconductor chip.

13. The method of claim 10, comprising coupling a third semiconductor chip to a second side of the substrate.

14. An apparatus, comprising:
    a circuit board including a first side and a second side opposite to the first side, the second side having an aperture that does not extend to the first side;
    a first heat spreader positioned on the second side and including a first portion positioned in the aperture with a surface facing away from the aperture, and a second portion having at least one projection extending beyond the aperture and adapted to thermally contact a second heat spreader; and
    a stack positioned on the second side, the stack including a first semiconductor chip positioned on the surface of the first heat spreader and a substrate having a first side coupled to the first semiconductor chip.

15. The apparatus of claim 14, wherein the circuit board comprises a chip package substrate.

16. The apparatus of claim 14, wherein the second heat spreader comprises a lid coupled to the circuit board.

17. The apparatus of claim 14, wherein the substrate comprises a second semiconductor chip.

18. The apparatus of claim 14, comprising a third semiconductor chip coupled to a second side of the substrate.

19. The apparatus of claim 14, wherein the aperture comprises a channel.

20. The apparatus of claim 14, comprising a thermal interface material positioned between and in contact with the first semiconductor chip and the first heat spreader.

21. An apparatus, comprising:
    a semiconductor chip package substrate including a first side and a second side opposite the first side, the second side having an aperture;
    a first heat spreader positioned on the second side, the first heat spreader including a first portion positioned in the aperture and with a surface facing away from the aperture, and a second portion having at least one projection extending beyond the aperture and adapted to thermally contact a second heat spreader; and
    a stack positioned on the second side, the stack including a first semiconductor chip positioned on the surface of the first heat spreader, an interposer having a first side coupled to the first semiconductor chip and a second side, and a second semiconductor chip coupled to the second side.

22. The apparatus of claim 21, wherein the second heat spreader comprises a lid coupled to the semiconductor chip package substrate.

23. The apparatus of claim 21, wherein the interposer comprises a third semiconductor chip.

24. The apparatus of claim 21, wherein the aperture comprises a channel.

25. The apparatus of claim 21, comprising a thermal interface material positioned between and in contact with the first semiconductor chip and the heat spreader.

* * * * *